United States Patent [19]
Cox et al.

[11] Patent Number: 5,309,122
[45] Date of Patent: May 3, 1994

[54] MULTIPLE-LAYER MICROSTRIP ASSEMBLY WITH INTER-LAYER CONNECTIONS

[75] Inventors: Brian J. Cox, Louisville; Russell W. Johnson; Patrick Westfeldt, Jr., both of Boulder, all of Colo.

[73] Assignee: Ball Corporation, Muncie, Ind.

[21] Appl. No.: 967,828

[22] Filed: Oct. 28, 1992

[51] Int. Cl.⁵ .......................... H01P 5/18; H01P 3/18
[52] U.S. Cl. ..................................... 333/116; 29/830; 333/24 C; 333/246
[58] Field of Search ............... 333/24 C, 116.35, 238, 333/246; 29/600, 830

[56] References Cited

U.S. PATENT DOCUMENTS

| | | |
|---|---|---|
| 2,754,484 | 7/1956 | Adams . |
| 3,303,439 | 2/1967 | Fulp . |
| 3,345,589 | 10/1967 | Di Piazza . |
| 3,883,828 | 5/1975 | Cappucci . |
| 4,375,053 | 2/1983 | Viola et al. ......................... 333/116 |
| 4,459,568 | 7/1984 | Landt ................................... 333/116 |
| 4,761,654 | 8/1988 | Zaghloul ............................. 343/700 |
| 4,803,450 | 2/1989 | Burgess et al. ................... 29/830 X |
| 4,810,981 | 3/1989 | Herstein ............................... 333/27 |
| 4,906,953 | 3/1990 | Li et al. ................................. 333/33 |
| 4,980,659 | 12/1990 | Allard .................................. 333/33 |
| 5,031,308 | 7/1991 | Yamashita et al. .................... 29/830 |
| 5,261,153 | 11/1993 | Lucas ................................... 29/830 |

Primary Examiner—Paul Gensler
Attorney, Agent, or Firm—Gilbert E. Alberding

[57] ABSTRACT

A multiple-layer microstrip assembly having an inter-layer connection for transitioning electrical signals between analogous surfaces of separate layers, comprising a plurality of layers, each having a top surface and a bottom surface; first top circuitry disposed on the first top surface of a first layer; first bottom circuitry disposed on the first bottom surface of the first layer; connecting means for electrically connecting the first top circuitry to the first bottom circuitry; second top circuitry disposed on the second top surface of a second layer; and binding means to hold the two layers together, wherein the first bottom circuitry is sufficiently adjacent and overlapping the second top circuitry to form an electrical connection therebetween, thereby forming a signal transition between the first top surface of the first layer and the second top surface of the second layer.

52 Claims, 7 Drawing Sheets

PRIOR ART

PRIOR ART

MULTIPLE-LAYER MICROSTRIP ASSEMBLY WITH INTER-LAYER CONNECTIONS

BACKGROUND OF THE INVENTION

1. Field of the Invention

This invention relates to a multiple-layer microstrip or stripline assembly and, more specifically, to transitioning electrical signals between two or more separate layers. A microstrip is a type of waveguide comprising a conductor, typically in a flat, rectangular shape, separated from a single ground plane by a dielectric substrate material. A buried microstrip is a variation on the basic microstrip wherein the single conductor is embedded in a dielectric substrate material. A stripline is similar to a buried microstrip, except that a stripline has two ground planes—one located along each major surface of the dielectric substrate material.

2. Description of the Related Art

Many systems utilize multiple-layer microstrip assemblies in which various circuit elements are sandwiched between separate layers of dielectric material and laminated together to form a single composite structure. The types of various circuit elements to be used may include both passive and active components, as well as transmission lines (equivalently referred to as feedlines). One reason for using multiple-layer construction is to avoid electromagnetic interference between the signals present in the feedlines and circuit elements by isolating them from one another. In one frequently used configuration, the feedlines are arranged on the top surface of the bottom-most layer, separated by a dielectric substrate material from a ground plane located on the bottom surface of the bottom-most layer, while the various other circuit elements are distributed among the upper layers of the assembly.

When the feedlines and circuit elements which comprise a system are distributed over a plurality of separate layers, however, it becomes necessary to route signals back and forth between different layers to interconnect the various circuitry. For example, to implement a certain circuit function it may be necessary to connect a feedline on a first layer to a circuit element on a second layer. Additionally, i may be necessary to route several signals, originating on different layers, to appear on a single layer to facilitate connection to an external device.

The routing of signals between layers, however, presents problems. First, the process of constructing a microstrip assembly with inter-layer connections is time and labor intensive and burdensome due to the low tolerances for error. A known technique for constructing a multiple-layer microstrip assembly with inter-layer connections requires several steps as described below with reference to FIGS. 1A through 1E.

As illustrated in FIG. 1A, a ribbon 101 is connected by means of soldering to first top circuitry 103, for example, a circuit element or feedline, on a first layer 105.

Next, as shown in FIG. 1B, a second layer 107 must be brought into precise alignment with the first layer 105 such that the ribbon 101 may be passed through a hole 109 in the second layer 107. The task of aligning layers and feeding-through connecting ribbons requires a great deal of precision and is aggravated by the fact that, typically, several connections between the two layers, with each requiring a ribbon and alignment with a hole, must typically be made between the two layers.

As shown in FIG. 1C, the first layer 105 is then joined to the second layer 107 by means of a first laminate layer 111 therebetween. The first laminate layer 111 holds the ribbon 101 in a fixed position relative to the hole 109 in the second layer 107 and prevents disturbing the precise alignment achieved in the step performed as shown in FIG. 1B.

Next, as shown in FIG. 1D, the ribbon 101 passing through the hole 109 in the second layer 107 is connected by means of soldering to second top circuitry 113, for example, a circuit element or feedline, on the second layer 107. The ribbon 101 forms an ohmic electrical connection between the first top circuitry 103 on the first layer 105 and the second top circuitry 113 on the second layer 107 and completes the structure necessary to transition signals between analogous surfaces of two separate layers of a multiple-layer microstrip assembly.

Finally, as shown in FIG. 1E, an optional second laminate layer 115 may be disposed on top of the second layer 107 to cover the second top circuitry 113. The second laminate layer 115 insulates the second top circuitry 113 from unwanted ohmic short-circuits and holds the ribbon 101 firmly in position.

Although the above-described construction method provides a multiple-layer microstrip assembly capable of transitioning signals between separate layers, it has several drawbacks. Among the drawbacks, the prior method is time and labor intensive due to the need for a precise alignment step. Furthermore, the prior method presents a low tolerance for error due to the difficulty in aligning the small-sized hole and ribbon. Additionally, because the above-described structure requires a ribbon to be connected between two separate layers, the ribbon is subject to stress, possibly causing failure or an impedance mismatch, from any relative movement between the two layers during construction.

Another problem associated with routing signals between layers is that the interconnections may result in degradation of the signal due to reflections caused by impedance mismatches. It is for this reason that a prior multiple-layer microstrip assembly with inter-layer connections was likely to have diminished radio-frequency (RF) performance as compared to a single-layer microstrip assembly which did not require inter-layer connections.

Clearly, an apparatus and construction method for multi-layer microstrip assemblies that addresses these deficiencies is desirable.

SUMMARY OF THE INVENTION

It is an object of the present invention to provide a multiple-layer microstrip assembly with means for transitioning signals between analogous surfaces of two separate layers thereof.

It is also an object of the present invention to provide an improved method of constructing the above-mentioned multiple-layer microstrip assembly.

It is a further object of the present invention to provide an inter-layer connection for a multiple-layer microstrip assembly which provides RF performance comparable to that of a single layer assembly.

It is a further object of the present invention to provide a method of constructing a multiple-layer microstrip assembly with a reduced number of steps.

It is a further object of the present invention to provide a method of constructing a multiple-layer microstrip assembly wherein the interconnection of two pre-assembled layers may be completed by a single step of joining the two layers together.

The foregoing and other objects are achieved by joining a first layer that has circuitry on its top surface electrically connected to circuitry on its bottom surface, with a second layer that has circuitry on its top surface, wherein the circuitry on the bottom surface of the first layer overlaps the circuitry on the top surface of the second layer to form an electrical connection therebetween. Consequently, a signal transition between the top surface of the first layer and the top surface of the second layer is provided.

In one embodiment, the overlapping electrical connection is established by juxtaposing the first and second layers so that the circuitry on the bottom of the first layer is capacitively coupled to the circuitry on the top of the second layer.

In yet a further embodiment of the invention, the electrical connection between the circuitry on the top and bottoms of the first layer is accomplished by establishing a hole between the top and bottom, and then electrically connecting the top and bottom circuitry with an electrical connector that extends through the hole.

These and other features of the present invention will become evident from the detailed description set forth hereafter with reference to the accompanying drawings.

BRIEF DESCRIPTION OF DRAWINGS

A more complete understanding of the invention can be had by referring to the detailed description of the invention and the drawings in which.

DETAILED DESCRIPTION OF THE INVENTION

A detailed description of a multiple-layer microstrip assembly adapted to transition electrical signals between analogous surfaces of two layers thereof, and a method of constructing the assembly, is set forth below with reference to the figures.

Figure 1A:
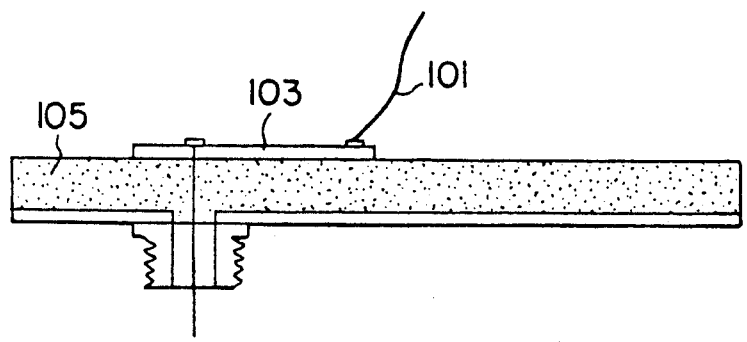
FIGS. 1A-1E are side assembly views of the five steps of a known method for constructing a multiple-layer microstrip assembly with an inter-layer connection.
Figure 1B:
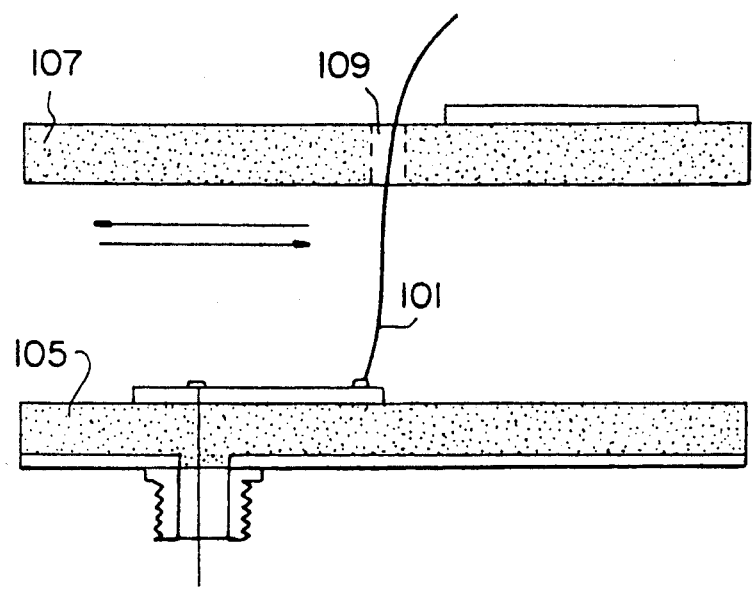
Figure 1C:
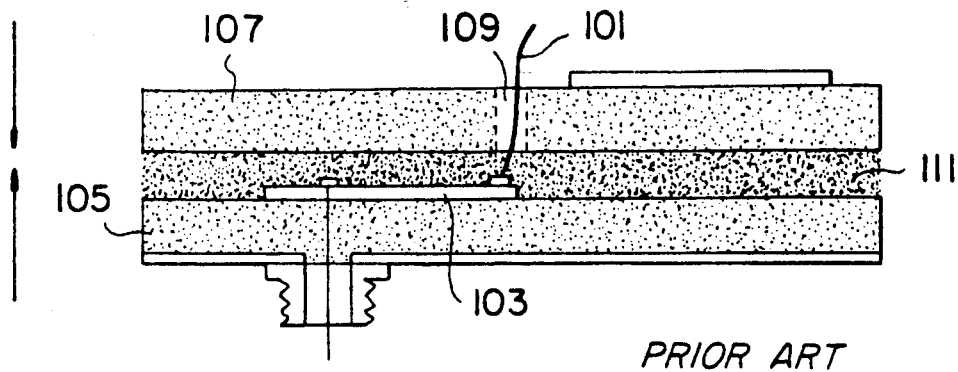
Figure 1D:
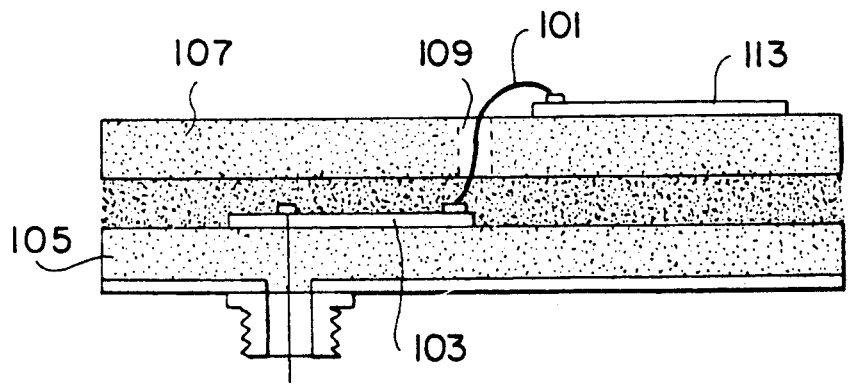
Figure 1E:
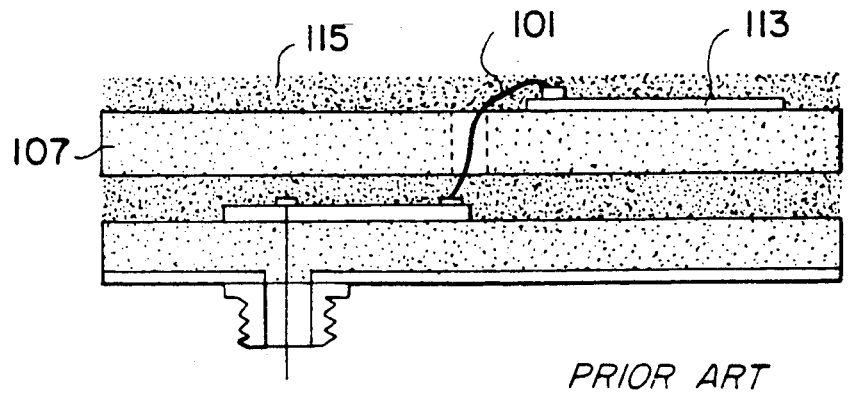
Figure 2A:
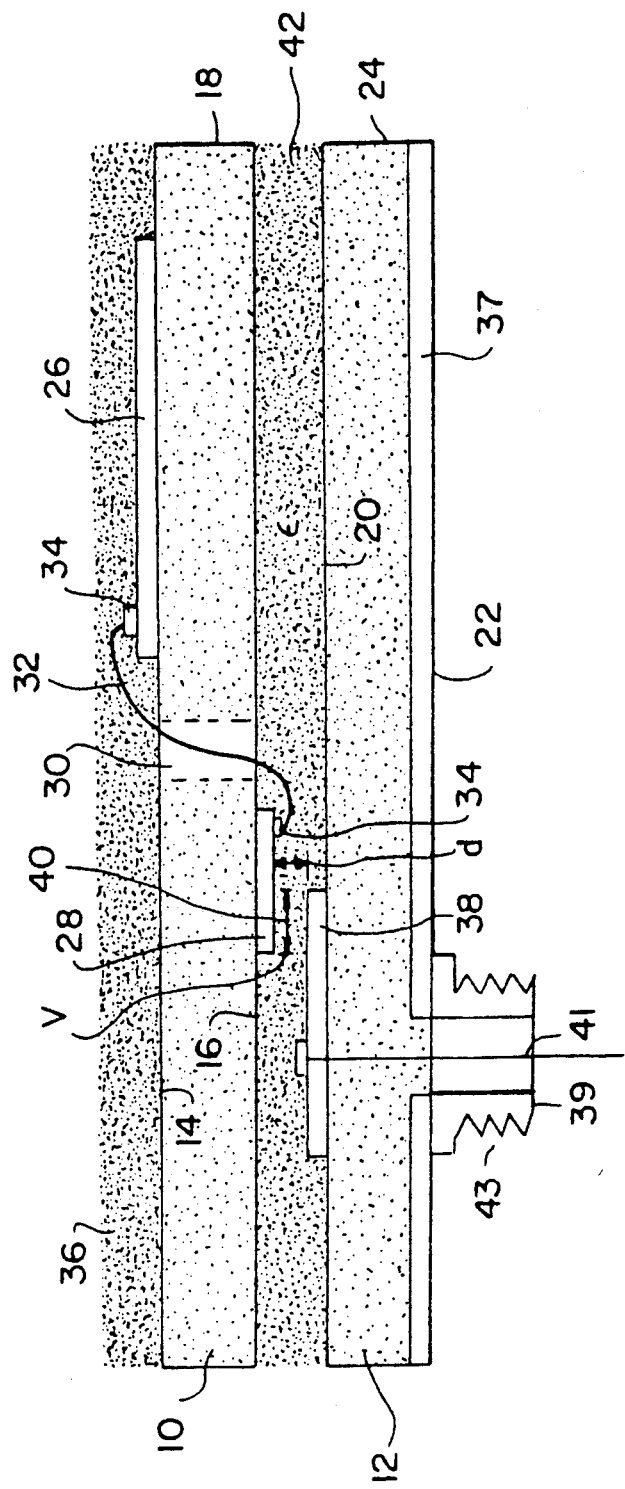
FIG. 2A is a side view showing the interconnection of two layers of a microstrip assembly in accordance with one embodiment of the present invention.
Figure 2B:
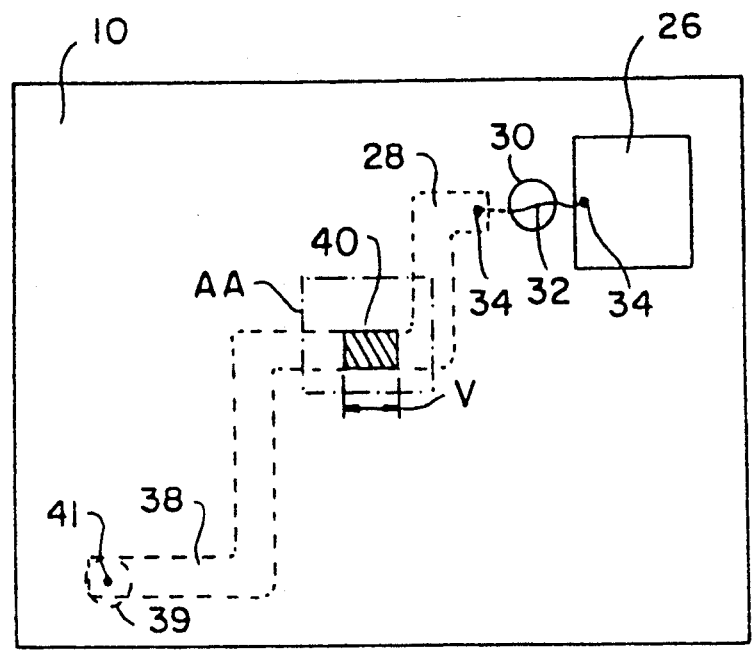
FIG. 2B is a top view of the apparatus shown in FIG. 2A.
Figure 2C:
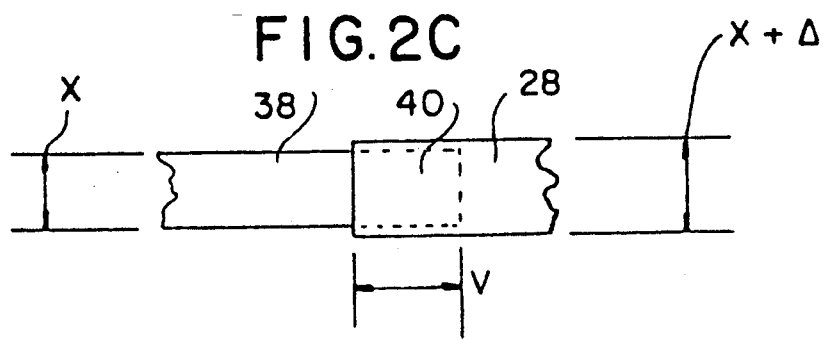
FIG. 2C is an enlarged view of the Region AA from FIG. 2B.
Figure 3:
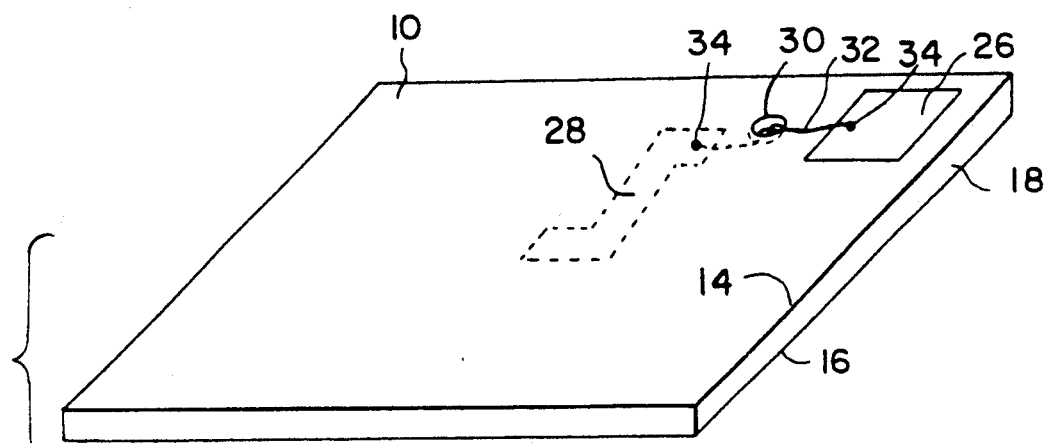
FIG. 3 is an exploded perspective view of the microstrip assembly illustrated in FIG. 2A.
Figure 3:
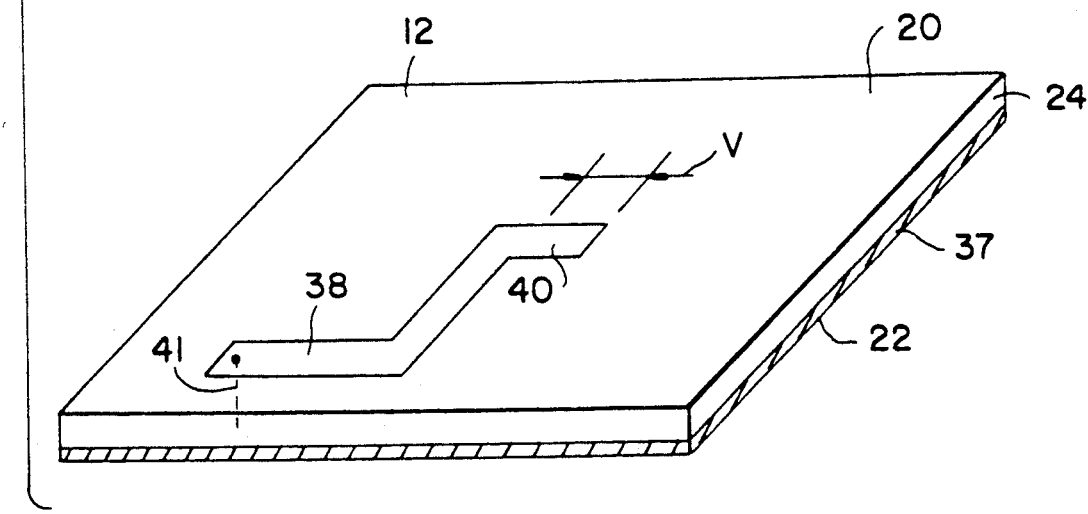

Referring to FIGS. 2A-3, the multiple-layer microstrip assembly according to one embodiment of the present invention illustrated therein comprises a first layer 10 and a second layer 12. The first layer 10 has a first top surface 14 and a first bottom surface 16 substantially parallel to the first top surface 14, separated by a first edge surface 18. Similarly, the second layer 12 has a second top surface 20 and a substantially parallel second bottom surface 22, separated by a second edge surface 24. Each of the first layer 10 and the second layer 12 is composed of a suitable dielectric material.

Disposed on the first top surface 14 of the first layer 10 is first top circuitry 26, and disposed on the first bottom surface 16 of the first layer 10 is first bottom circuitry 28. Each of the first top circuitry 26 and the first bottom circuitry 28 may comprise, for example, a circuit element, a feedline, printed circuitry, or a combination thereof. In this particular embodiment, the first layer 10 has a hole 30 connecting the first top surface 14 and the first bottom surface 16. The hole 30 has an appropriately sized diameter such that an electrically conductive member 32, for example, a wire or a ribbon, may pass therethrough. Alternatively, the hole 30 can be plated with an electrically conductive material or an electrically conductive eyelet can be established in the hole 30. The electrically conductive member 32 is comprised of appropriate conductive material to establish an electrical connection between the first top circuitry 26 and the first bottom circuitry 28.

As an alternative to using the electrically conductive member 32 to connect the first top circuitry 26 to the first bottom circuitry 28, these two sets of circuitry may be so constructed as to form a single unitary member rather than distinct sets of circuitry with a separate connection means therebetween. This may be accomplished, for example, by plating the first layer 10 to establish the first top circuitry 26 and the first bottom circuitry 28, and at the same time plate the hole 30 to establish an electrical connection between the first top circuitry 26 and the first bottom circuitry 28.

As shown, the electrically conductive member 32 is positioned within the hole 30 such that one end of the electrically conductive member 32 abuts the first top circuitry 26 and the other end of the electrically conductive member 32 abuts the first bottom circuitry 28 at attachment points 34. The electrically conductive member 32 is attached, for example, by a solder joint. The attachment of the electrically conductive member 32 at attachment points 34 forms an ohmic electrical connection between the first top circuitry 26 and the first bottom circuitry 28.

According to the embodiment of the present invention as illustrated in FIGS. 2A-3 an optional first laminate layer 36 comprising, for example, a resin material having suitable dielectric and bonding characteristics, is disposed on top of the first top surface 14 of the first layer 10. The purpose of the optional first laminate layer 36, inter alia, is to electrically insulate the first top circuitry 26, and to secure each of the first top circuitry 26 and the electrically conductive member 32 in place.

Disposed on the second top surface 20 of the second layer 12 is second top circuitry 38. The second top circuitry 38 may comprise, for example, a circuit element, a feedline, printed circuitry, or a combination thereof. A ground plane 37 is arranged along the second bottom surface 22 of the second layer 12. An input connector 43, for example, a coaxial connector—comprising a housing 39 and a feed pin 41—is attached to the ground plane 37 such that the housing 39 is physically and electrically connected to the ground plane 37, while the feed pin 41, or signal carrying line, passes through a gap in the ground plane 37 into the dielectric substrate material comprising the second layer 12, to physically and electrically connect to the second top circuitry 38, for example, by means of soldering.

The first layer 10 and the second layer 12 are oriented such that the first bottom surface 16 of the first layer 10 faces opposite the second top surface 20 of the second layer 12. The second top circuitry 38 is positioned adjacent and overlapping with the first bottom circuitry 28.

An electrical connection exists between the second top circuitry 38 and the first bottom circuitry 28 in the overlap region 40 by means of capacitive coupling between the two sets of circuitry. Capacitive coupling provides a reliable and easy method for establishing an electrical connection between the two sets of circuitry. If certain requirements are met, as discussed below, a capacitively coupled electrical connection performs comparably to an ohmic electrical connection. Moreover, the capacitively coupled connection is established merely by bonding the two sets of circuitry in an adjacent and overlapped position using a lamination layer of suitable bonding and dielectric properties. Because no physical connection need be maintained between the two sets of circuitry to establish a capacitively coupled connection, the reliability of the assembly is enhanced.

Another possible embodiment with a different means of forming an electrical connection between the two sets of circuitry involves bringing the first bottom circuitry 28 into physical contact with the second top circuitry 38 such that an ohmic electrical connection, rather than a capacitively coupled electrical connection, is formed therebetween. Typically, such a connection, however, involves a greater degree of difficulty in construction because the two sets of circuitry to be electrically connected must be held in constant physical contact to ensure a stable electrical connection. For example, to establish an ohmic electrical connection between the first bottom circuitry 28 and the second top circuitry 38 in the microstrip assembly illustrated in FIG. 2A, it would be necessary to laminate the first layer 10 to the second layer 12 such that the first bottom circuitry 28 was held in constant physical contact with the second top circuitry 38 with no laminate material in between the two sets of circuitry.

In the embodiment of the present invention shown in FIG. 2A utilizing capacitive coupling, the characteristics of the resultant capacitively coupled electrical connection are determined by several parameters. Initially, when operating at higher frequencies, such as in the RF range, it is important that interconnections between circuit elements be impedance matched to minimize signal reflections and maximize power transfer. One method to achieve an impedance matched connection is to create an overlap length of $\lambda/4$ between the two sets of circuitry. As shown in FIG. 2A, the overlap length, V, of this embodiment is substantially equal to $\lambda/4$ thereby establishing an impedance matched electrical connection.

Alternatively, the overlap length, V, may be equal to a length other than $\lambda/4$ as long as the overlapped surface area establishes sufficient capacitive coupling between the first bottom circuitry 28 and the second top circuitry 38. For example, an overlap length other than $\lambda/4$ may be desirable for systems which operate over a broad band of frequencies and not just RF frequencies.

The capacitance of the connection, C, is determined by the equation:

$$C = \epsilon A/d \quad (i)$$

where $\epsilon$ is the dielectric constant of the material in between the two sets of circuitry, A is the surface area of the overlapped region, and d is the separation of the two sets of circuitry. The impedance of the connection, Z, is determined by the equation:

$$Z = -j/\omega C \quad (ii)$$

where $-j$ is equal to the square-root of $-1$, $\omega$ is equal to $2\pi$ times the frequency, and C is the capacitance of the connection, calculated according to equation (i), above. When appropriate values of $\epsilon$, A, and d are used, the capacitance, C, is great enough so that the impedance, Z, of the connection becomes negligible and the connection effectively appears as a short-circuit to RF signals.

Referring to FIG. 2C, a top view showing the overlap region 40 between the first bottom circuitry 28 and the second top circuitry 38 is illustrated. As shown, one of the two sets of circuitry, in this case the second top circuitry 38, is slightly narrower, by an amount $\Delta$, than the width of the first bottom circuitry 28, $X+\Delta$. The purpose of the difference in width, $\Delta$, is to provide a registration tolerance when constructing the apparatus of the present invention. More particularly, to ensure that the second top circuitry 38 sits entirely underneath the first bottom circuitry 28 within the overlap region 40, the second top circuitry 38 is slightly narrower to provide the necessary registration tolerance when constructing the microstrip assembly of the present invention.

Because the width of a feedline is inversely proportional to its characteristic impedance, the second top circuitry 38, taken alone, would have a characteristic impedance greater than the first bottom circuitry 28, taken alone, by an amount proportional to the difference in width, $\Delta$. When the two sets of circuitry are coupled in the manner described above, however, the characteristic impedance of the aggregate structure—that is, the two sets of circuitry combined—is determined solely by the width of the wider of the two sets of overlapping circuitry —in this case, the first bottom circuitry 28.

In the particular embodiment of FIGS. 2A-3, the second top circuitry 38 is held adjacent and overlapping with the first bottom circuitry 28 by means of a second laminate layer 42 to ensure an electrical connection during operation of the microstrip assembly. Although a laminate layer is used in this embodiment, alternative means, such as a support frame, clamps, screws, or springs, may be used to hold the first layer 10 and the second layer 12 together.

Figure 4:
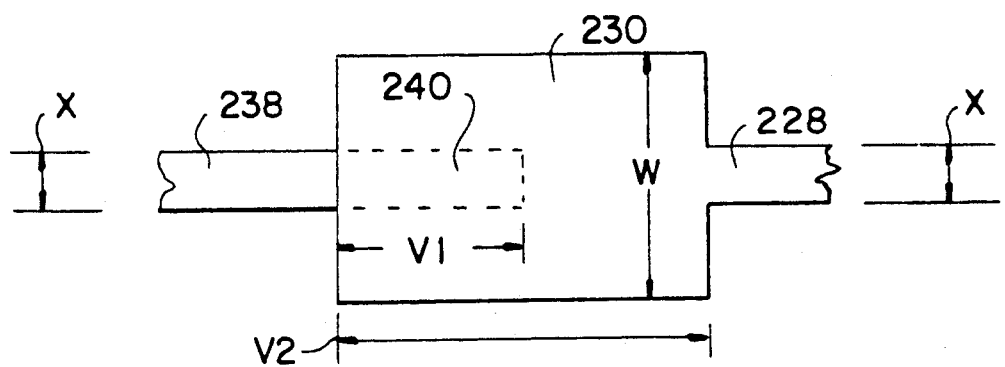
FIG. 4 is a top view of an overlap connection according to another embodiment of the present invention.

An alternative embodiment with a different arrangement for the overlap of the two sets of circuitry, providing even greater registration tolerance, is illustrated in FIG. 4. In the particular embodiment depicted therein, each of the first bottom circuitry 228 and the second top circuitry 238 have a width X. The first bottom circuitry 228, however, has a terminal end 230, in the shape of a stub, with a width W significantly greater than X. The overlap configuration in the embodiment illustrated in FIG. 4 is an exception to the general rule that the width of wider of the two sets of circuitry determines the characteristic impedance of the aggregate coupled circuitry. In this embodiment the value of the width W is irrelevant with respect to the characteristic impedance of the overlapped circuitry. As long as the overlap length, V1, is substantially equal to $\lambda/4$, and the length, V2, of the terminal end 230 is substantially equal to $\lambda/2$, the characteristic impedance of the overall structure—that is, the first bottom circuitry 228 overlapped with the second top circuitry 238—is determined by the width X. Therefore, a value of W should be chosen such that adequate registration tolerance is provided in the overlap region 240. This embodiment has the advantages of providing ample registration tolerance while maintaining a consistent width, X, between the two sets of circuitry.

Figure 5:
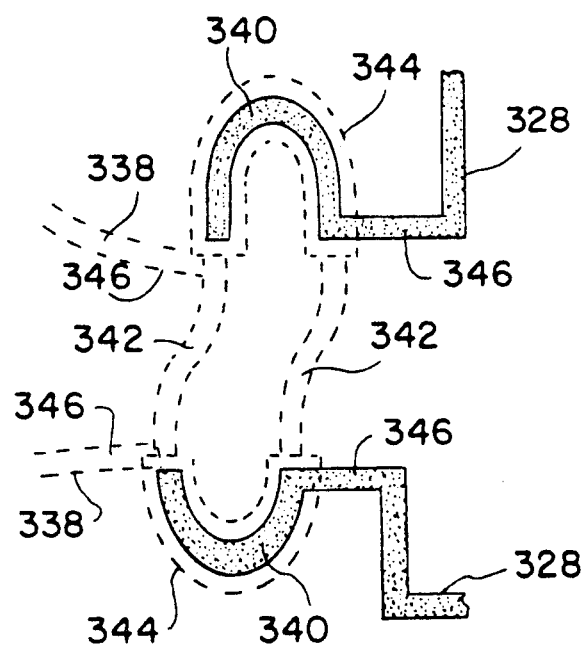
FIG. 5 is a top view of an overlap connection according to another embodiment of the present invention.

Still another embodiment of the present invention, which takes advantage of the structure of a branch-line quadrature hybrid circuit to form the overlapping electrical connection of the two sets of circuitry, is illustrated in FIG. 5. A branch-line quadrature hybrid circuit element is used to divide the power of an input signal among one or more output signals as well as to supply one or more output signals with phase differences, relative to the input signals, that are multiples of 90°. These phase differences are achieved by separating an input port that provides the input signal from an output port that provides an output signal by a transmission line that is $\lambda/4$ in length or a multiple thereof. In this embodiment the second top circuitry 338, represented by dashed lines, forms a first portion of a branch-line quadrature hybrid circuit that includes a closed loop conductive path. The first bottom circuitry 328, represented by solid lines, forms a second portion of the branch-line quadrature hybrid circuit. The first bottom circuitry 328 overlaps the second top circuitry 338 in the overlap regions 340 wherein a capacitively coupled electrical connection is established. The resulting structure formed by the overlap of the first bottom circuitry 328 and the second top circuitry 338 is referred to as a branch-line quadrature hybrid. This device has four ports 346 and is used, inter alia, for dividing power and supplying different phase outputs. In the branch-line quadrature hybrid, the length of each of the shunt arms 344 (the U-shaped portions) and the series arms 342 (the connecting portions) is substantially equal to $\lambda/4$. Additionally, the shunt arms 344 are wider, and therefore have a lower characteristic impedance, than each of the series arms 342 and the four ports 346.

The establishment of the overlapping, electrical connection between the first bottom circuitry 328 and the second top circuitry 338 using the branch-line quadrature hybrid structure provides several advantages. Specifically, the U-shaped portions provide a convenient location for the overlap of the two sets of circuitry to occur for the following reasons. First, the shunt arms 344, already having increased width for reasons of circuit operation, also provide the necessary registration tolerance for the overlap between the two sets of circuitry. As discussed above, the characteristic impedance of the overall shunt arm structure—that is, the overlap regions 340 formed by the respective U-shaped portions of the first bottom circuitry 328 and the second top circuitry 338—is determined by the wider of the two sets of circuitry, in this case, the second top circuitry 338. Consequently, the narrower width of the U-shaped portions of the first bottom circuitry 328 have little, if any, effect upon the RF performance of the hybrid.

Second, because the shunt arms 344 of the branch-line quadrature hybrid are already substantially equal to $\lambda/4$ in length for reasons of circuit operation, having the two sets of circuitry overlap in the U-shaped portions provides an overlap length substantially equal to $\lambda/4$, thereby ensuring an impedance matched electrical connection which effectively appears as a short-circuit to RF signals. The shunt arms 344, having the properties of both increased width and a $\lambda/4$ length are, therefore, a highly advantageous location for the overlap of the two sets of circuitry to occur in providing a transition for signals between the first and second layers.

Finally, because the first bottom circuitry 328 can be made narrower than the second top circuitry 338, two of the four ports 346 that are part of the first bottom circuitry 328 are narrower than the shunt arms 344 as required for proper operation of the hybrid.

It is important to note that the circuit elements and feedlines in the above-described embodiments must maintain the characteristics of a microstrip transmission line. As mentioned previously, a microstrip transmission line comprises a signal conductor separated from a single ground plane only by a dielectric material. Therefore, in each of the above-described embodiments there is no overlap between the first top circuitry and the combination of the first bottom circuitry and the second top circuitry. In other words, only dielectric material is present between the first top circuitry and the ground plane. At signal transition locations, however, the second top circuitry will be sandwiched between the first bottom circuitry and the ground plane by a predetermined overlap amount to form an electrical connection between the second top and first bottom circuitry.

The above-described apparatus is useful for transitioning electrical signals between analogous surfaces of separate layers of a multiple-layer microstrip assembly. Specifically, as shown in FIG. 2A, the electrical connection between the first top circuitry 26 and the first bottom circuitry 28 in conjunction with the electrical connection between the first bottom circuitry 28 and the second top circuitry 38 allows, for example, an electrical signal originating in the second top circuitry 38 to be routed through the first bottom circuitry 28 to the first top circuitry 26. Thus, an apparatus is provided which allows an electrical signal to be transitioned from a specific surface of one layer to the analogous surface of a different layer. For example, in the embodiment illustrated in FIGS. 2A-3, an electrical signal may be routed from the second top surface 20 of the second layer 12 to the first top surface 14 of the first layer 10. Of course, the transitioning, or routing, of electrical signals between different layers may be viewed as proceeding in either direction. For example, the embodiment of the present invention as illustrated in FIGS. 2A-3 is equally well suited for transitioning signals from first layer to the second layer as it is for transitioning signals from the second layer to the first layer.

Several advantages arise from using the embodiment of the present invention as illustrated in FIGS. 2A-3. For example, this embodiment provides a structure which allows electrical signals to exit or enter circuitry on a separate layer other than the layer on which the signal originated. Further, the embodiment of FIGS. 2A-3 allows circuitry to be distributed among a plurality of layers while maintaining RF circuit performance comparable to that of circuitry arranged on a single layer. Another advantage is the increased reliability of this configuration. Because the two attachment points 34 of the electrically conductive member 32 are each located on the same layer—that is, the first layer 10—the electrically conductive member 32 is subjected to less stress caused by relative movement between two separate layers during construction. Accordingly, the electrical connections at attachment points 34 are less likely to fail due to breakage or stress-induced impedance increase.

A method of constructing the above-described multiple-layer microstrip assembly with means for transitioning electrical signals between analogous surfaces of two layers thereof, is set forth below with reference to FIGS. 6A through 6D.

Figure 6A:
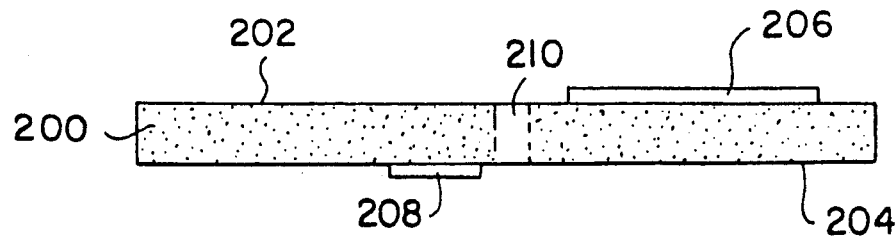
FIGS. 6A-6D are side assembly views of the four steps of a method for constructing a microstrip assembly with an inter-layer connection according to the present invention.

Initially, as shown in FIG. 6A, a first layer 200, composed of a suitable dielectric material, is provided having a first top surface 202 and a first bottom surface 204. First top circuitry 206 is arranged on the first top surface 202 and first bottom circuitry 208 is arranged on the first bottom surface 204. The first layer 200 has a hole 210 passing through the center thereof connecting the first top surface 202 to the first bottom surface 204.

Figure 6B:
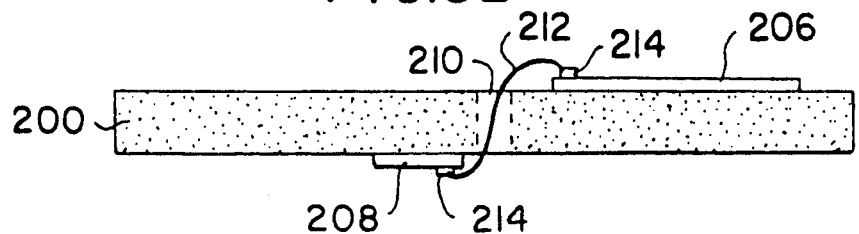

Next, as illustrated in FIG. 6B, an electrical connection member 212, for example, a ribbon or a wire, is passed through the hole 210 in the first layer 200 and attached, for example, by means of soldering, to each of the first top circuitry 206 and the first bottom circuitry 208 at attachment points 214, thus forming an ohmic electrical connection between the first top circuitry 206 and the first bottom circuitry 208.

As an alternative to using the electrically conductive member 212 to connect the first top circuitry 206 to the first bottom circuitry 208, these two sets of circuitry may be so constructed as to form a single unitary member rather than distinct sets of circuitry with a separate connection means therebetween as previously discussed.

Figure 6C:
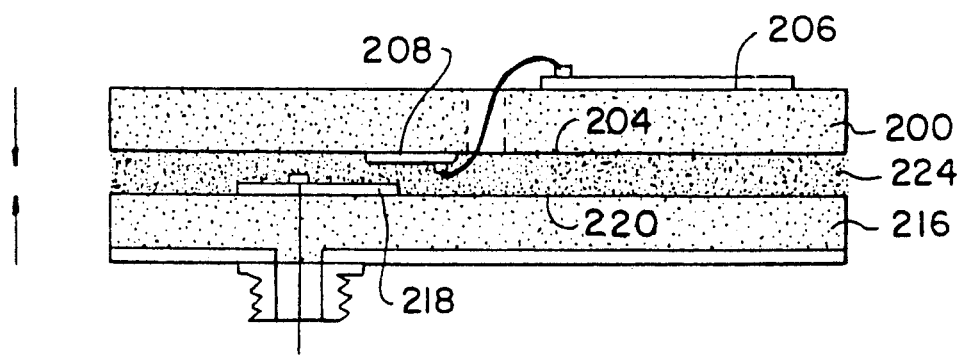

As shown in FIG. 6C, the first layer 200 is then bound to a second layer 216, which is composed of a suitable dielectric material and which has second top circuitry 218 arranged on a second top surface 220 thereof. The first layer 200 and the second layer 216 are positioned such that the first bottom circuitry 208 is brought adjacent and overlapping with the second top circuitry 218 when the two layers are bound together. The overlap forms a capacitively-coupled electrical connection between the first bottom circuitry 208 and the second top circuitry 218. Consequently, the formation of an electrical connection between the first bottom circuitry 208 and the second top circuitry 218, along with the previously formed electrical connection between the first top circuitry 206 and the first bottom circuitry 208, completes the structure necessary to transition signals between analogous surfaces of two separate layers.

In the particular embodiment illustrated in FIGS. 6A through 6D, the first layer 200 is bound to the second layer 216 by means of a laminating step to form a first lamination layer 224 deposited between the first bottom surface 204 of the first layer 200 and the second top surface 220 of the second layer 216. Alternatively, means such as a support frame, clamps, screws, or springs may be utilized to perform the binding operation between the first layer 200 and the second layer 216.

Figure 6D:
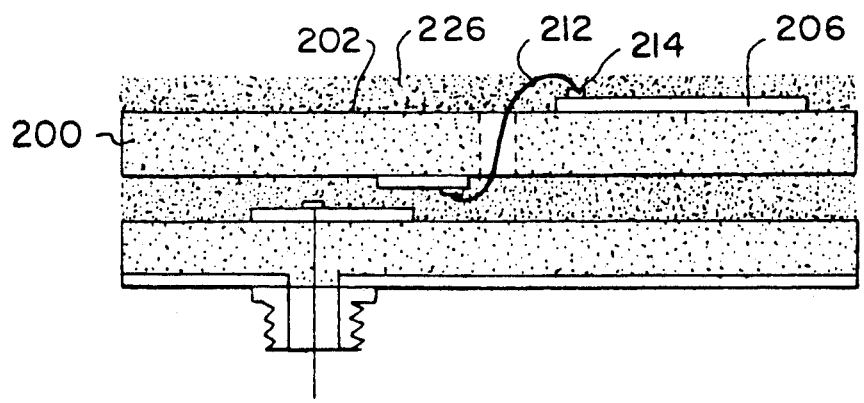

Finally, as shown in FIG. 6D, an optional second laminating step may be performed to form a second lamination layer 226 deposited on top of the first top surface 202 of the first layer 200. The second lamination layer 226 insulates the first top circuitry 206 and holds the electrical connection member 212 firmly in position. Alternatively, the step illustrated in FIG. 6D may be performed between the steps illustrated in FIG. 6B and FIG. 6C, respectively. That is, the optional second lamination layer 226 may be deposited on the first top surface 202 of the first layer 200 before the first layer 200 and the second layer 216 are bound together to form an electrical connection between the first bottom circuitry 208 and the second top circuitry 218.

Several advantages arise from using the method of construction of the embodiment of the present invention as illustrated in FIGS. 6A through 6D. The above-described method for constructing a multiple-layer microstrip assembly with an inter-layer connection allows for quick, easy, and less costly construction of the microstrip assembly than the method used previously. For example, each type of layer may be separately mass pre-constructed, stored, and used as needed without having to individually construct each layer at the time of construction of the overall microstrip assembly. Specifically, the electrical connection member 212 may be pre-connected between the first top circuitry 206 and the first bottom circuitry 208, and the optional second lamination layer 226 may be deposited on the first top surface 202 to complete construction of the first layer 200. Following pre-construction of the layers, when assembly of the overall microstrip system is desired, the only step remaining is binding, or laminating, the first layer 200 to the second layer 216, thereby forming an electrical connection between the first bottom circuitry 208 and the second top circuitry 218. In this way, the time and labor intensive step of aligning the first and second layers is avoided. Additionally, the method of construction of the present invention allows each layer to be separately pre-constructed so that the first top circuitry and the first bottom circuitry may be electrically connected before laminating the first layer and second layer together. Thus, the assembly procedure is made streamlined and less costly.

Although the invention has been described in detail, it should be understood that various changes, substitutions and alterations can be made herein without departing from the spirit and scope of the invention as defined by the appended claims.

What is claimed is:

1. A method of constructing a multiple-layer microstrip assembly adapted to transition electrical signals between analogous surfaces of two layers thereof, comprising the steps of:

attaching an electrical connection member to each of a first op circuitry disposed on a first top surface of a first layer and a first bottom circuitry disposed on a separate first bottom surface of the first layer, wherein the first bottom surface is substantially parallel to the first top surface, thereby forming an electrical connection between the first top circuitry and the first bottom circuitry;

providing a second layer that has a second top surface, a separate second bottom surface which is substantially parallel to the second top surface, and second top circuitry that is disposed on the second top surface;

providing a ground plane;

arranging each of the first top circuitry, the first bottom circuitry, the second top circuitry, and the ground plane so that the second top circuitry of said second layer is located between the first bottom surface of the first layer and the second bottom surface of the second layer, such that said ground plane underlies said first top circuitry, first bottom circuitry, and said second top circuitry, such that a surface area of the first top circuitry does not overlap with a combined surface area of the first bottom circuitry and the second top circuitry relative to said ground plane and such that substantially only dielectric material is located between said first top circuitry and said ground plane and between said second top circuitry and said ground plane; and binding the first bottom surface of the first layer to the second top surface of the second layer to hold the first bottom circuitry sufficiently adjacent and overlapping the second top circuitry disposed on the second top surface of the second layer to form an electrical connection between the first bottom circuitry and the second top circuitry, thereby forming an electrical connection between the first top circuitry and the second top circuitry.

2. A method of constructing a multiple-layer microstrip assembly according to claim 1, further comprising the steps of:

prior to said attaching step, forming the first layer with the first top circuitry on the first top surface and the first bottom circuitry on the first bottom surface; and prior to said attaching step, forming the second layer with the second top circuitry on the second top surface.

3. A method of constructing a multiple-layer microstrip assembly according to claim 1, further comprising the step of:

laminating the first top surface of the first layer.

4. A method of constructing a multiple-layer microstrip assembly according to claim 1, wherein said attaching step comprises the steps of:

passing the electrical connection member through a hole in the first layer between the first top surface and the first bottom surface; and connecting the electric the first top circuitry and the first bottom circuitry.

5. A method of constructing a multiple-layer microstrip assembly according to claim 1, further comprising step comprises bonding, with an adhesive dielectric material, the first bottom surface of the first layer to the second top surface of the second layer, wherein said adhesive dielectric material extends between said first bottom circuitry and said second top circuitry whereby said electrical connection is a capacitive electrical connection.

6. A method of constructing a multiple-layer microstrip assembly according to Claim 1, further comprising the steps of:

prior to said binding step, aligning the first layer and the second layer in substantial registration and in substantially parallel orientation.

7. A method of constructing a multi-layer microstrip assembly according to claim 1, wherein said first bottom circuitry and said second top circuitry overlap by substantially λ/4.

8. A method of constructing a multi-layer microstrip assembly according to claim 1, wherein said first bottom circuitry and said second top circuitry have different widths to provide registration tolerance.

9. A method of constructing a multi-layer microstrip assembly according to claim 1, wherein said first bottom circuitry and said second top circuitry each have substantially a first width, and one of said first bottom circuitry and said second top circuitry has a terminal end with a stub having a second width that is greater than said first width and a length substantially equal to one-half of the wavelength of a frequency at which the microstrip assembly operates, wherein said stub and the other of said first bottom circuitry and said second top circuitry are located so that said overlap region therebetween extends for a distance that is substantially equal to one-quarter the wavelength.

10. A method of constructing a multi-layer microstrip assembly according to claim 1, wherein said first bottom circuitry and second top circuitry form a branch-line quadrature circuit.

11. A multiple-layer assembly adapted for transitioning electrical signals between analogous surfaces of two layers thereof, comprising:

a plurality of layers, each having a top surface and a bottom surface separated by an edge surface, wherein the top surface is substantially parallel to the bottom surface;

first top circuitry disposed on a first top surface of a first layer of said plurality of layers;

first bottom circuitry disposed on a first bottom surface of said first layer;

connecting means, mounted on said first layer, for electrically connecting said first top circuitry to said first bottom circuitry;

second top circuitry disposed on a second top surface of a second layer of said plurality of layers; and adhesive binding means, operatively engaged to each of said first layer and said second layer, to hold said first layer and said second layer so that said second top surface is located between said first bottom surface and said second bottom surface and so that said first bottom circuitry is located sufficiently adjacent, overlapping and spaced from said second top circuitry, with a dielectric material therebetween, to form a capacitive electrical connection therebetween, thereby forming an electrical connection between said first top circuitry disposed on the first top surface of said first layer and said second top circuitry disposed on the second top surface of said second layer.

12. A multiple-layer assembly according to claim 11, wherein said connecting means comprises a ribbon.

13. A multiple-layer assembly according to claim 11, wherein said connecting means comprises an eyelet.

14. A multiple-layer assembly according to claim 11, wherein said connecting means comprises a plated-through hole.

15. A multiple-layer assembly according to claim 11, wherein said first top circuitry comprises a printed circuit feedline, said first bottom circuitry comprises a printed circuit feedline and said second top circuitry comprises a printed circuit feedline.

16. A multiple-layer assembly according to claim 11, further comprising:

a lamination layer adjacent to the first top surface of said first layer.

17. A multiple-layer assembly according to claim 11, wherein said first layer comprises portions defining a hole between the first top surface and the first bottom surface through which said connecting means passes to electrically connect said first top circuitry to said first bottom circuitry.

18. A multiple-layer assembly according to claim 11, further comprising a ground plane disposed on a second bottom surface of said second layer, wherein said first layer and said second layer each comprise dielectric substrate material, and wherein each of said first top, first bottom, and second top circuitry are arranged such that, in areas other than in a predetermined area of overlap of said first bottom circuitry and said second top circuitry where an electrical connection is desired, only dielectric substrate material is present between said ground plane and each of said first top, first bottom, and second top circuitry.

19. A multiple-layer assembly according to claim 11, wherein said first bottom circuitry and said second top circuitry are arranged to form an overlap defining a branch-line quadrature hybrid that includes a closed loop conductive path.

20. A multiple-layer assembly according to claim 11, wherein said first bottom circuitry and said second top circuitry are arranged to form a one-quarter wavelength overlap region.

21. A multiple-layer assembly according to claim 11, wherein said first bottom circuitry and said second top circuitry are arranged to form an overlap region, and wherein one of said first bottom circuitry and said second top circuitry is wider than the other of said first bottom circuitry and said second top circuitry by a predetermined amount to provide a registration tolerance in the overlap region.

22. A multiple-layer assembly, as claimed in claim 11, wherein:
said adhesive binding means includes a dielectric adhesion binding means.

23. A multiple-layer assembly, as claimed in claim 11, wherein:
one of said plurality of layers includes a ground plane that underlies said first top circuitry, first bottom circuitry, and second top circuitry; and
said first top circuitry and said second top circuitry arranged so that substantially only dielectric material is between said first top circuitry and said ground plane and between said second top circuitry and said ground plane.

24. A multiple-layer microstrip assembly adapted for transitioning electrical signals between analogous surfaces of two layers thereof, comprising:
(a) a plurality of layers, each having a top surface and a bottom surface separated by an edge surface, wherein the top surface is substantially parallel to the bottom surface, and the edge surface is substantially perpendicular to each of the top and bottom surfaces;
(b) first top circuitry disposed on a first top surface of a first layer of said plurality of layers;
(c) first bottom circuitry disposed on a first bottom surface of said first layer;
(d) connecting means, mounted on said first layer, for electrically connecting said first top circuitry to said first bottom circuitry;
(e) second top circuitry disposed on a second top surface of a second layer of said plurality of layers; and
(f) binding means, engaged to each of said first layer and said second layer, to hold said first bottom circuitry sufficiently adjacent and overlapping said second top circuitry to form an electrical connection therebetween, thereby forming an electrical connection between said first top circuitry disposed on the first top surface of said first layer and said second top circuitry disposed on the second top surface of said second layer, wherein a surface area of said first top circuitry does not overlap with a combined surface area of said first bottom circuitry and said second top circuitry;
wherein said second layer comprises a microstrip transmission line including:
a dielectric substrate layer forming top, bottom, and edge surfaces of said second layer;
a ground plane disposed on the second bottom surface of said second layer; and
a signal conductor disposed on the second top surface of said second layer, wherein said signal conductor and said ground plane are separated by said dielectric substrate layer.

25. A multiple-layer microstrip assembly adapted for transitioning electrical signals between analogous surfaces of two layers thereof, comprising:
(a) a plurality of layers, each having a top surface and a bottom surface separated by an edge surface, wherein the top surface is substantially parallel to the bottom surface, and the edge surface is substantially perpendicular to each of the top and bottom surfaces;
(b) first top circuitry disposed on a first top surface of a first layer of said plurality of layers;
(c) first bottom circuitry disposed on a first bottom surface of said first layer;
(d) connecting means, mounted on said first layer, for electrically connecting said first top circuitry to said first bottom circuitry;
(e) second top circuitry disposed on a second top surface of a second layer of said plurality of layers; and
(f) binding means, engaged to each of said first layer and said second layer, to hold said first bottom circuitry sufficiently adjacent and overlapping said second top circuitry to form an electrical connection therebetween, thereby forming an electrical connection between said first top circuitry disposed on the first top surface of said first layer and said second top circuitry disposed on the second top surface of said second layer, wherein a surface area of said first top circuitry does not overlap with a combined surface area of said first bottom circuitry and said second top circuitry;
wherein said first bottom circuitry and said second top circuitry have substantially equal widths, and one of said first bottom circuitry and said second top circuitry has a terminal end defining a stub having an arbitrary width and a length substantially equal to one-half of a wavelength, wherein said stub and the other of said first bottom circuitry and second top circuitry are arranged to form a one-quarter wavelength overlap region.

26. A multiple layer assembly forming a branch-line quadrature hybrid that can be used to transition signals between analogous surfaces of two layers of said multiple-layer assembly comprising:
a plurality of layers, each having a top surface and a bottom surface separated by an edge surface, wherein the top surface is substantially parallel to the bottom surface;
first bottom circuitry disposed on a first bottom surface of a first layer of said plurality of layers;
second top circuitry disposed on a second top surface of a second layer of said plurality of layers, said top circuitry includes a closed loop conductive path;
binding means, engaged to each of said first layer and said second layer, for holding at least a portion of said first bottom circuitry sufficiently adjacent and overlapping at least a portion of said second top circuitry to form an electrical connection therebetween, wherein a branch-line quadrature hybrid is formed by a combination of said bottom circuitry, said closed loop conductive path of said second top circuitry, and the overlap therebetween.

27. A multiple-layer microstrip assembly forming a branch-line quadrature hybrid according to claim 26, wherein the electrical connection between said bottom circuitry and said top circuitry is formed by capacitive coupling therebetween.

28. A multiple-layer microstrip assembly forming a branch-line quadrature hybrid according to claim 26, wherein the electrical connection between said bottom circuitry and said top circuitry is formed by an ohmic connection therebetween.

29. A multiple-layer assembly forming a branch-line quadrature hybrid according to claim 26, wherein said branch-line quadrature hybrid includes four ports spaced from one another around said closed loop conductive path by substantially $\lambda/4$.

30. A multiple-layer assembly forming a branch-line quadrature hybrid according to claim 26, wherein said closed loop conductive path includes a first portion that has a first width and a second portion that has a second width which is different than said first width.

31. A multiple-layer assembly forming a branch-line quadrature hybrid according to claim 26, further including first top circuitry located on a first top surface of said first layer and first interconnect circuitry extending between said first top circuitry and said first bottom circuitry, wherein an electrical connection is established between said first top circuitry and said second top circuitry.

32. A multiple-layer assembly forming a branch-line quadrature hybrid according to claim 26, wherein said portion of said first bottom circuitry and said portion of said second top circuitry that form said electrical connection have different widths.

33. A multiple-layer assembly forming a branch-line quadrature hybrid according to claim 26, wherein said portion of said first bottom circuitry and said portion of said second top circuitry that form said electrical connection overlap one another by substantially $\lambda/4$.

34. A multiple-layer assembly forming a branch-line quadrature hybrid according to claim 26, wherein said portion of said first bottom circuitry and said portion of said second top circuitry that form said electrical connection are each curved.

35. A multiple-layer assembly forming a branch-line quadrature hybrid according to claim 26, wherein said branch-line quadrature hybrid includes four ports, wherein said first bottom circuitry includes two ports of said four ports and said second top circuitry includes the other two ports of said four ports.

36. A multiple-layer assembly forming a branch-line quadrature hybrid according to claim 26, further including:
first top circuitry disposed on a first top surface of said first layer;
interconnect circuitry connecting said first top circuitry and said first bottom circuitry;
a ground plane underlying said first top circuitry, first bottom circuitry and second top circuitry;
said first top circuitry and said second top circuitry arranged so that substantially only dielectric material is between said first top circuitry and said ground plane and between said second top circuitry and said ground plane.

37. A multi-layer microstrip assembly adapted for transitioning electrical signals between analogous surfaces of two layers thereof, comprising:
a first layer that has a first top surface and a first bottom surface that is separated from said first top surface;
first circuitry that includes first top circuitry which is located on said first top surface, first bottom circuitry which is located on said first bottom surface, and first interconnect circuitry which connects said first top circuitry and said first bottom circuitry;
a second layer that includes a second top surface and a second bottom surface which is separated from said second top surface;
second circuitry that includes second top circuitry that is located on said second top surface;
said first layer and said second layer positioned so that said second top surface is located between said first bottom surface and said second bottom surface; and
a ground plane underlying at least said first top circuitry and said second top circuitry;
wherein said first top circuitry and said first bottom circuitry are located so that said first top circuitry is laterally displaced from said first bottom circuitry and there is substantially no overlap therebetween relative to said ground plane;
wherein said first bottom circuitry and said second top circuitry are located so that said first bottom circuitry overlaps said second top circuitry relative to said ground plane to form an overlap region and electrically connect said first bottom circuitry and said second top circuitry, thereby electrically connecting said first top circuitry and said second top circuitry;
wherein said first top circuitry and said second top circuitry are located so that there is substantially no overlap between said first top circuitry and said second top circuitry relative to said ground plane;
wherein substantially only dielectric material is located between first top circuitry and said ground plane and between said second top circuitry and said ground plane.

38. A multi-layer microstrip assembly, as claimed in claim 37, further comprising:
a dielectric material located between said first bottom circuitry and said second top circuitry to capacitively electrically connect said first bottom circuitry and said second top circuitry.

39. A multi-layer microstrip assembly, as claimed in claim 37, further comprising:
an adhesive dielectric material located between said first bottom circuitry and said second top circuitry to capacitively electrically connect said first bottom circuitry and said second top circuitry and to mechanically connect said first layer to said second layer.

40. A multi-layer microstrip assembly, as claimed in claim 37, further comprising:
an adhesive dielectric material extending substantially throughout a space extending from said first layer to said second layer.

41. A multi-layer microstrip assembly, as claimed in claim 37, wherein:

said overlap region extends for a distance that is substantially equal to one-quarter of the wavelength of a frequency at which the microstrip assembly operates.

42. A multi-layer microstrip assembly, as claimed in claim 37, wherein:
one of said first bottom circuitry and said second top circuitry is narrower than the other in said overlap region.

43. A multi-layer microstrip assembly, as claimed in claim 37, wherein:
said first bottom circuitry and said second top circuitry each have substantially a first width, and one of said first bottom circuitry and said second top circuitry has a terminal end with a stub having a second width that is greater than said first width and a length substantially equal to one-half of the wavelength of a frequency at which the microstrip assembly operates, wherein said stub and the other of said first bottom circuitry and said second top circuitry are located so that said overlap region therebetween extends for a distance that is substantially equal to one-quarter the wavelength.

44. A multi-layer microstrip assembly, as claimed in claim 37, wherein:
said first bottom circuitry and second top circuitry form a branch-line quadrature circuit.

45. A multi-layer microstrip assembly, as claimed in claim 37, further comprising:
a lamination layer adjacent to said first top surface of said first layer.

46. A method for constructing a multiple-layer assembly adapted to transition electrical signals between analogous surfaces of two layers thereof, comprising the steps of:
first providing a first layer that includes a first substrate with a first top surface and a first bottom surface that is separated from said first top surface, and first circuitry that includes first top circuitry located on said first top surface, first bottom circuitry that is located on said first bottom surface, and interconnect circuitry extending between said first top circuitry and said first bottom circuitry;
second providing a second layer that includes a second substrate with a second top surface and a second bottom surface that is separated from said second top surface, and second circuitry that includes second top circuitry that is located on said second top surface; and
bonding, using an adhesive, said first layer to said second layer so that said second top surface is between said first bottom surface and said second bottom surface and so that said first bottom circuitry overlaps said second top circuitry to form an overlap region and to capacitively electrically connect said first bottom circuitry and said second top circuit, thereby electrically connecting said second top circuitry to said first top circuitry.

47. A method, as claimed in claim 46, wherein:
said steps of first providing and second providing include defining one of said first bottom circuitry and said second top circuitry to be wider than the other so that there is registration tolerance during said step of adhesively bonding.

48. A method, as claimed in claim 46, wherein:
said steps of first providing and second providing include defining said first bottom circuitry and said second top circuitry to each have substantially a first width, and one of said first bottom circuitry and said second top circuitry to have a terminal end with a stub having a second width that is greater than said first width and a length substantially equal to one-half of the wavelength of a frequency at which the microstrip assembly operates, wherein during said step of adhesively bonding said stub and the other of said first bottom circuitry and said second top circuitry are located so that said overlap therebetween extends for a distance that is substantially equal to one-quarter the wavelength.

49. A method, as claimed in claim 46, wherein:
said steps of first providing and second providing include defining said first bottom circuitry to include a first element needed to form a branch-line quadrature circuit and said second top circuitry to include a second element needed to form said branch-line quadrature circuit, wherein one of said first element and said second element has a width greater than the other of said first element sand said second element to provide registration tolerance during said step of adhesively bonding.

50. A method, as claimed in claim 46, further includes:
positioning a ground plane beneath at least said first top circuitry and said second top circuitry; and
said step of adhesively bonding includes positioning said first top circuitry and said first bottom circuitry so that said first top circuitry is laterally displaced from said first bottom circuitry and there is substantially no overlap therebetween relative to said ground plane, said first top circuitry and said second top circuitry so that there is substantially no overlap therebetween relative to said ground plane, wherein substantially only dielectric material is located between said first top circuitry and said ground plane and between said second top circuitry and said ground plane.

51. A method, as claimed in claim 46, further including:
a ground plane underlying said first top circuitry, said first bottom circuitry and said second top circuitry; and
wherein said first top circuitry and said second top circuitry arranged so that substantially only dielectric material is between said first top circuitry and said ground plane and between said second top circuitry and said ground plane.

52. A method for constructing a multiple-layer microstrip assembly adapted to transition electrical signals between analogous surfaces of two layers thereof, comprising the steps of:
first providing a first layer that includes a first substrate with a first top surface and a first bottom surface that is separated from said first top surface, and first circuitry that includes first top circuitry located on said first top surface, first bottom circuitry that is located on said first bottom surface, and interconnect circuitry extending between said first top circuitry and said first bottom circuitry, said first top circuitry laterally offset from said first bottom circuitry;
second providing a second layer that includes a second substrate with a second top surface and a second bottom surface that is separated from said second top surface, and second circuitry that includes second top circuitry that is located on said second top surface; and positioning said first layer and said second layer with respect to one another so that said first bottom circuitry and said second top circuitry lie outside a vertical region between said first top circuitry and said second layer, and said first bottom circuitry and said second top circuitry form an electrical connection to electrically connect said second top circuitry to said first top circuitry;

said step of positioning includes binding said first layer to said second layer so that said first bottom circuitry and said second top circuitry are capacitively coupled.

* * * * *